United States Patent
Beaudoin et al.

(10) Patent No.: US 8,116,082 B2
(45) Date of Patent: Feb. 14, 2012

(54) FAN TRAY THAT IS INSTALLABLE AND REMOVABLE FROM THE FRONT AND BACK OF A NETWORK ELEMENT CHASSIS

(75) Inventors: Denis J. F. Beaudoin, Surrey (CA); Allen A. Hirashiki, San Ramon, CA (US); Bernardino Ramirez, San Jose, CA (US); Manuel Jude Fernandes, Vancouver (CA)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 262 days.

(21) Appl. No.: 12/620,518

(22) Filed: Nov. 17, 2009

(65) Prior Publication Data

US 2011/0116233 A1    May 19, 2011

(51) Int. Cl.
*H05K 5/00* (2006.01)
*H05K 7/20* (2006.01)
*A47G 19/08* (2006.01)

(52) U.S. Cl. ........ 361/724; 361/695; 361/752; 454/184; 211/41.17

(58) Field of Classification Search .................. 361/695, 361/724, 752; 454/184; 211/41.17
See application file for complete search history.

(56) References Cited

U.S. PATENT DOCUMENTS

| | | | | |
|---|---|---|---|---|
| 4,914,552 | A | * | 4/1990 | Kecmer ........................ 361/801 |
| 5,562,410 | A | * | 10/1996 | Sachs et al. ................ 415/213.1 |
| 5,689,406 | A | * | 11/1997 | Wood et al. .................. 361/796 |
| 5,822,184 | A | * | 10/1998 | Rabinovitz ............... 361/679.31 |
| 6,297,962 | B1 | * | 10/2001 | Johnson et al. ............... 361/726 |

(Continued)

OTHER PUBLICATIONS

"Replacing the Fan Tray on an M40e Router", Juniper Networks, Aug. 27, 2009, 3 pages.

(Continued)

*Primary Examiner* — Bradley Thomas
(74) *Attorney, Agent, or Firm* — Blakely, Sokoloff, Taylor & Zafman LLP

(57) ABSTRACT

A fan tray for a network element that is installable and removable from the front and back of a network element. The fan tray includes one or more fans in a housing to provide cooling for the network element, an engagement rod with ends that protrude out a front and back of the housing, a first engagement lever at one end of the engagement rod and a second engagement lever at an opposite end of the engagement rod, the first and second engagement levers are movable between an unlocked and locked position and movement is tied together, a gearing mechanism coupled to the engagement rod to translate rotational force applied to the engagement levers into linear force to extend and withdraw a backplane connector assembly coupled to the gearing mechanism. The backplane connector assembly includes a backplane connector to engage and disengage with a fan tray connector of a backplane of the network element in a plane perpendicular to the installation plane of the fan tray according to movement of the engagement levers responsive to the engagement levers respectively moving to the locked and unlocked position.

22 Claims, 14 Drawing Sheets

U.S. PATENT DOCUMENTS

| | | | |
|---|---|---|---|
| 6,424,111 B1 * | 7/2002 | Romig | 318/568.21 |
| 6,549,424 B1 * | 4/2003 | Beseth et al. | 361/801 |
| 6,594,150 B2 * | 7/2003 | Creason et al. | 361/727 |
| 6,600,656 B1 * | 7/2003 | Mori et al. | 361/724 |
| 6,674,651 B2 * | 1/2004 | Momiyama et al. | 361/796 |
| 6,685,489 B1 * | 2/2004 | Rubenstein et al. | 439/157 |
| 6,714,411 B2 | 3/2004 | Thompson et al. | |
| 6,891,728 B1 * | 5/2005 | Mease et al. | 361/724 |
| 6,975,519 B2 * | 12/2005 | Siahpolo et al. | 361/798 |
| 6,988,626 B2 * | 1/2006 | Varghese et al. | 211/26 |
| 7,027,309 B2 * | 4/2006 | Franz et al. | 361/798 |
| 7,210,751 B2 * | 5/2007 | Nakayama | 312/332.1 |
| 7,542,300 B1 * | 6/2009 | Lui et al. | 361/755 |
| 7,791,865 B2 * | 9/2010 | Wirtzberger et al. | 361/679.01 |
| 7,924,570 B2 * | 4/2011 | Randall et al. | 361/724 |
| 2003/0117779 A1 * | 6/2003 | Gough et al. | 361/728 |
| 2004/0130868 A1 | 7/2004 | Schwartz et al. | |
| 2005/0174743 A1 * | 8/2005 | Downing et al. | 361/725 |
| 2006/0256522 A1 | 11/2006 | Wei et al. | |

OTHER PUBLICATIONS

"Cisco uBR10012 Universal Broadband Router Fan Assembly Module", Document Part Number: OL-5093-01, Cisco Systems, Inc., Oct. 2003, 18 pages.

* cited by examiner

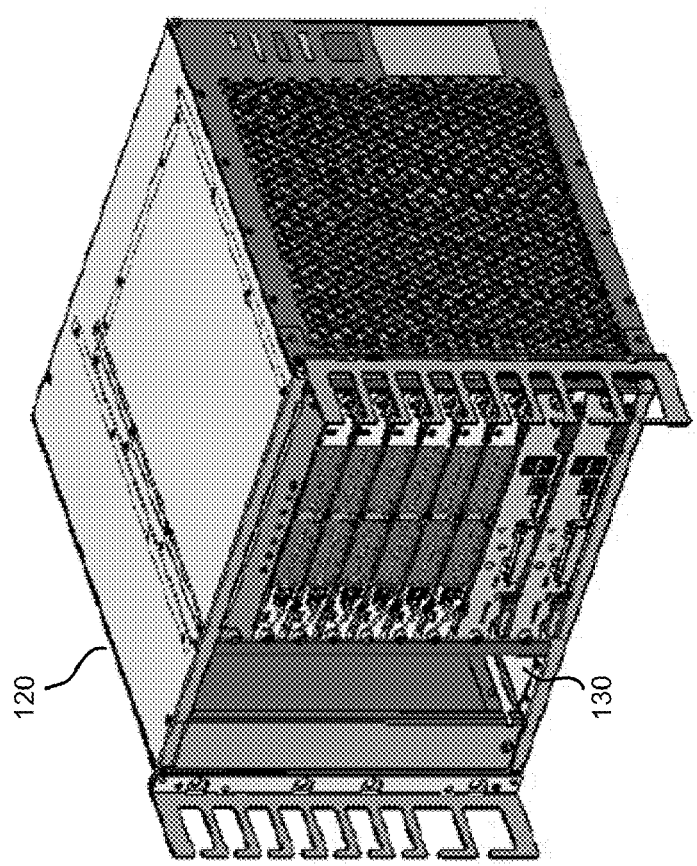
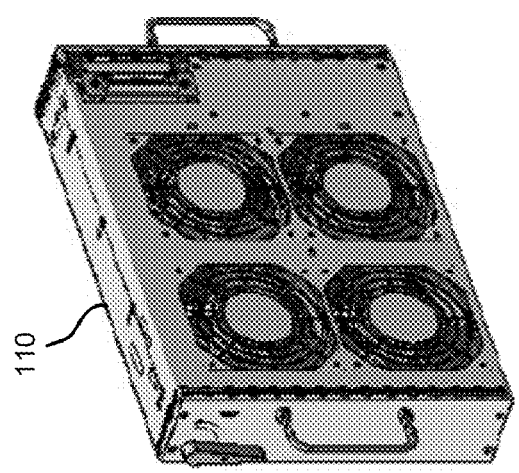
FIG. 1A

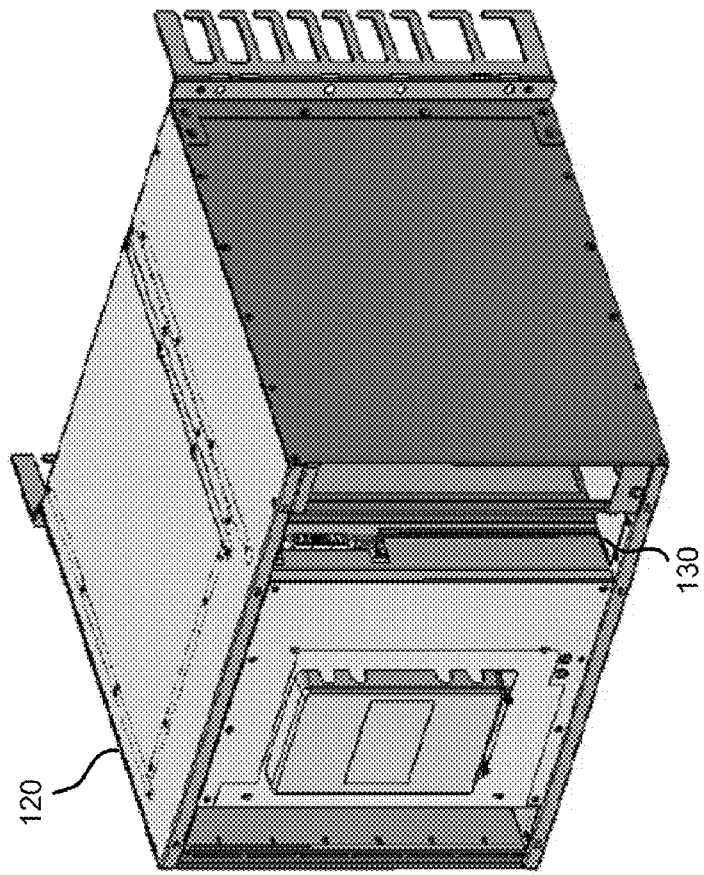
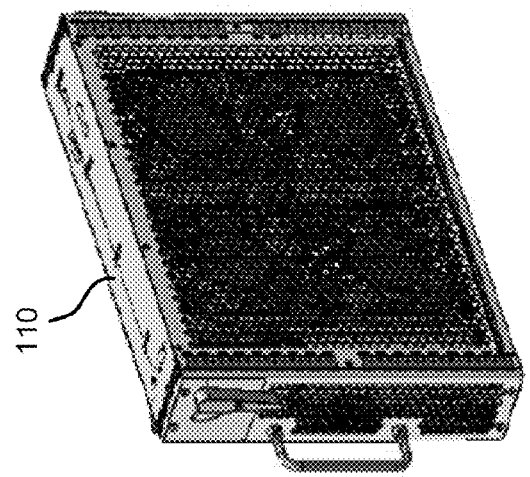
FIG. 1B

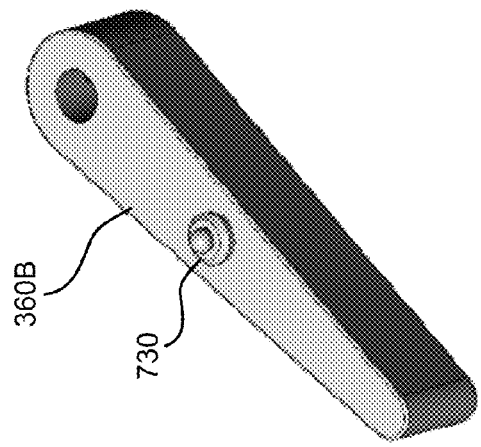
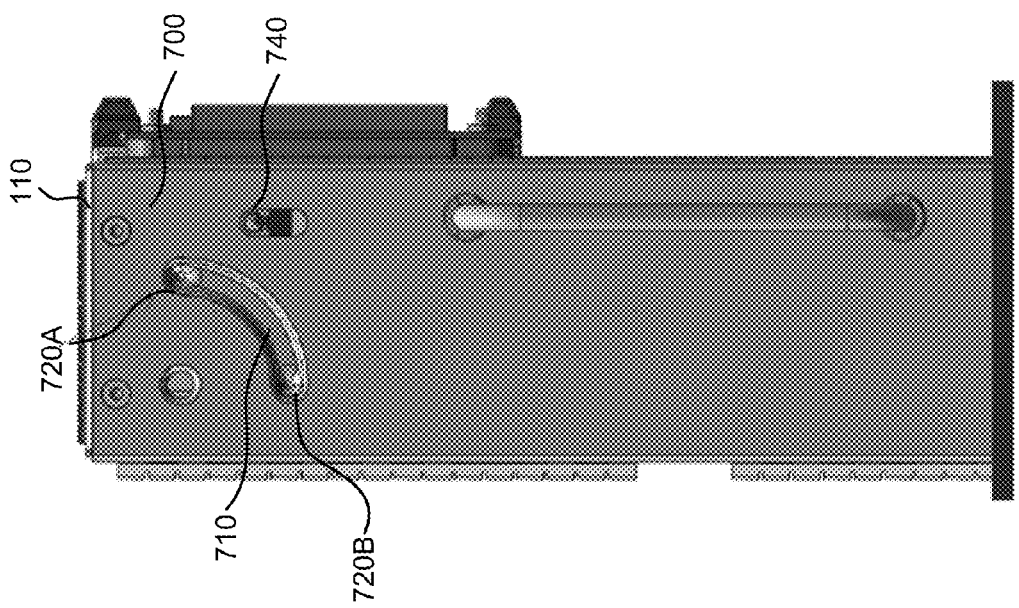
FIG. 7B
FIG. 7A

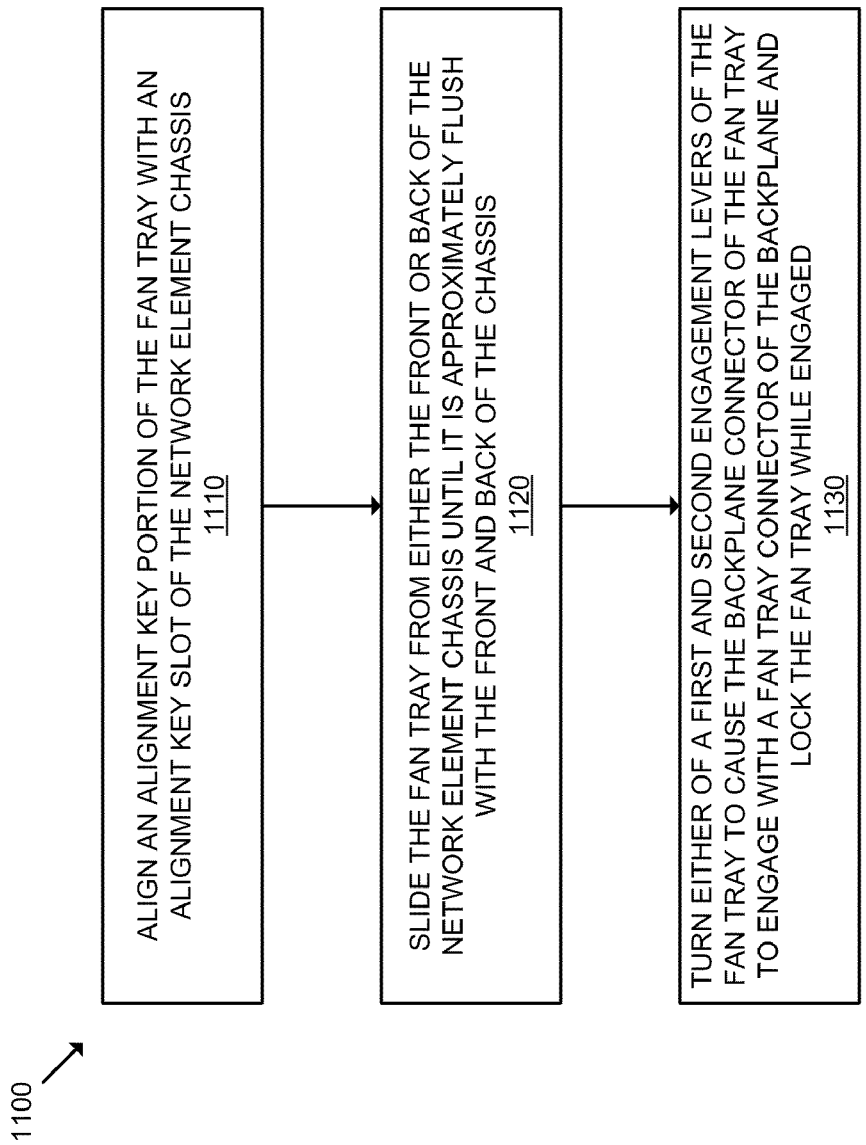

FAN TRAY THAT IS INSTALLABLE AND REMOVABLE FROM THE FRONT AND BACK OF A NETWORK ELEMENT CHASSIS

BACKGROUND

1. Field

Embodiments of the invention relate to the field of network element chassis; and more specifically to fan trays in network element chassis that can be installed and removed from the front and back of the network element chassis.

2. Background

Network elements (e.g., a router, switch, bridge, etc.) are pieces of networking equipment, including hardware and software, that communicatively interconnects other equipment on the network (e.g., other network elements, end stations, etc.). Network elements commonly include multiple cards (line cards, control cards, and/or service cards) which may be connected together or with other equipment through cables.

A network element chassis, which houses the components of the network element, commonly houses one or more fans to provide cooling for the network element. These one or more fans are typically included in a standalone component commonly referred to as a fan tray. Prior art fan trays can be installed and removed in only one direction. Some are installed/removed from the front of the network element chassis while others are installed/removed from the back of the network element chassis. Those fan trays that are installed/removed from the front of the network element chassis have the disadvantage that cabling likely needs to be removed prior to removing the fan tray. Those fan trays that are installed/removed from the back of the network element chassis have the disadvantage that the network element chassis may need to be moved in order to have physical access to the back of the chassis.

SUMMARY

A fan tray for a network element that is installable and removable from the front and back of the network element that includes a housing that forms a tunnel running between the front and back of the network element to create an installation plane. The fan tray includes one or more fans in a housing to provide cooling for the network element. The fan tray also includes an engagement rod with ends that protrude out a front and back of the housing. A first engagement lever is at one end of the engagement rod and a second engagement lever is at the other end of the engagement rod. The first and second engagement levers are movable between an unlocked and locked position and their movement is tied together. The fan tray also includes a gearing mechanism coupled to the engagement rod to translate rotational force, applied to move the engagement levers between the unlocked and locked position, into linear force to extend and withdraw a backplane connector assembly coupled to the gearing mechanism. The backplane connector assembly includes a backplane connector to engage and disengage with a fan tray connector of a backplane of the network element in a plane perpendicular to the installation plane according to the movement of the engagement levers. The backplane connector is to engage and disengage with the fan tray connector responsive to the engagement levers moving to the locked and unlocked position respectively while the fan tray is in the installable position, whereby the fan tray is installable and removable from the front and back of the network element.

A network element chassis is adapted to allow a fan tray to be installed and removed from the front and back of the network element chassis. The network element chassis includes a card housing for each of one or more line cards and one or more control cards, wherein each of the card housings forms a slot with an opening on the front of the network element. The chassis also includes a fan tray housing for the fan tray to allow the fan tray to be inserted and removed from the front and back of the network element chassis without removing a panel or cover of the fan tray, wherein the fan tray housing forms a tunnel running between the front and back of the network element to create an installation plane, wherein there is an installable position in the tunnel along the installation plane for the fan tray, the fan housing including one or more guide channels to guide insertion and removal of the fan tray. The chassis also includes a backplane including a fan tray connector to engage and disengage with a backplane connector of the fan tray in a plane perpendicular to an installation plane of the fan tray.

A network element including a fan tray that is installable and removable from the front and back of the network element. The network element includes a card housing for each of one or more line cards and one or more control cards, wherein each of the card housings forms a slot with an opening on the front of the network element and a connector at the back of the network element. The network element also includes a fan tray housing for the fan tray that allows the fan tray to be inserted and removed from the front and back of the network element chassis without removing a panel or cover of the fan tray, wherein the fan tray housing forms a tunnel running between the front and back of the network element to create an installation plane, and wherein there is an installable position in the tunnel along the installation plane for the fan tray. The network element also includes a backplane including a fan tray connector to engage and disengage with a backplane connector of the fan tray. The fan tray includes one or more fans in a housing that provide cooling for the network element, an engagement rod with ends that protrude out a front and back of the housing, wherein the engagement rod is within the installation plane when the fan tray is installed, a first engagement lever at one end of the engagement rod and a second engagement lever at an opposite end of the engagement rod that move between an unlocked and locked position, wherein movement of the first and second engagement levers is tied together, and wherein the first and second engagement levers prevent the fan tray from being installed or removed from the network element when in the locked position, a gearing mechanism coupled to the engagement rod that translates rotational force, applied to the engagement levers, into linear force to extend and withdraw a backplane connector assembly coupled to the gearing mechanism, and the backplane connector assembly including the backplane connector that engages and disengages with the fan tray connector of the backplane in a plane perpendicular to the installation plane of the fan tray according to the movement of the engagement levers, the backplane connector to engage and disengage with fan tray connector responsive to the engagement levers respectively moving to the locked and unlocked position while the fan tray is in the installable position, whereby the fan tray is installable and removable from the front and back of the network element.

A method to install a fan tray in a network element chassis that includes a housing that forms a tunnel passing all the way through the network element to create an installation plane, wherein the fan tray includes a first and second engagement lever on opposite sides of the fan tray to both lock and unlock the fan tray and engage and disengage a backplane connector of the fan tray to a fan tray connector of a backplane of the network element chassis, wherein there is an installable position in the tunnel along the installation plane for the fan tray. An alignment key portion of the fan tray is aligned with an alignment key slot of the network element chassis to ensure proper orientation of the fan tray, wherein the alignment key portion prevents the fan tray from being inserted in the wrong orientation. The fan tray is slide from either the front or back of the network element chassis until it is approximately flush with the front and back of the network element chassis, wherein the engagement levers are in an unlocked position while the fan tray is slid into the network element chassis. While the fan tray is approximately flush with the front and back of the network element chassis, either of the first and second engagement levers is turned in a first direction to cause the backplane connector to engage the fan tray connector and lock the fan tray while engaged, wherein turning one of the engagement levers causes the other engagement lever to automatically turn substantially the same amount, wherein the engagement levers are in a locked position while the backplane connector is engaged to the fan tray connector and prevent the fan tray from being removed from the front and back of the network element chassis, and wherein one or more protective guides that extend beyond the backplane connector guide the backplane connector to safely engage the fan tray connector to prevent the connectors from being damaged, whereby the fan tray is installable from the front and back of the network element chassis

BRIEF DESCRIPTION OF THE DRAWINGS

The invention may best be understood by referring to the following description and accompanying drawings that are used to illustrate embodiments of the invention. In the drawings:

FIG. 1A illustrates the front of an exemplary network element chassis and an exemplary fan tray according to one embodiment of the invention;

FIG. 1B illustrates the back of an exemplary network element chassis and an exemplary fan tray according to one embodiment of the invention;

FIG. 7A illustrates the end of the fan tray according to one embodiment of the invention;

FIG. 7B illustrates an exemplary engagement lever according to one embodiment of the invention;

FIG. 11 is a flow diagram illustrating exemplary operations for installing a fan tray from either the front or back of a network element chassis according to one embodiment of the invention.

DETAILED DESCRIPTION

Figure 2B:
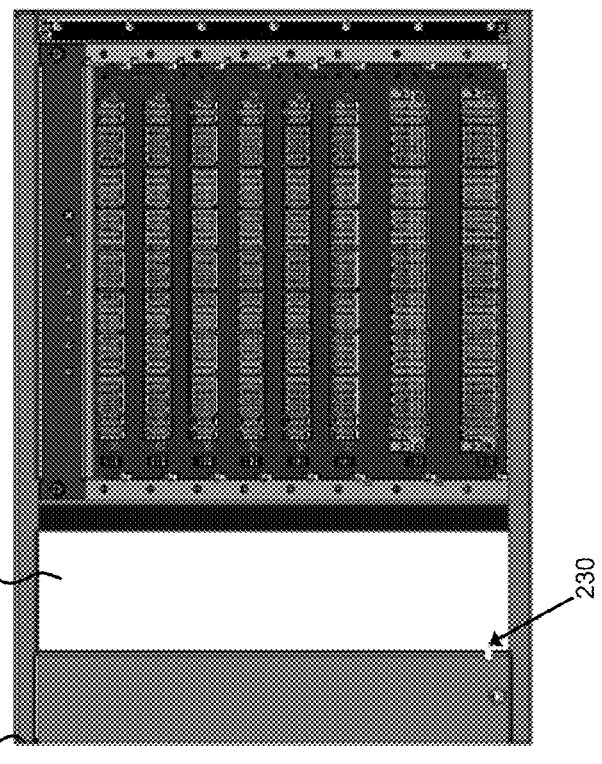
FIG. 2B illustrates an exemplary network element chassis including an alignment key slot according to one embodiment of the invention.

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

A fan tray that can be installed and removed from the front and back of a network element chassis is described. FIG. 1A illustrates the front of an exemplary network element chassis 120 and an exemplary fan tray 110 according to one embodiment of the invention. The network element chassis 120 includes the fan tray housing 130 that allows the fan tray 110 to be inserted and removed from either the front or back of the network element chassis 120. The fan tray housing 130 forms a tunnel running between the front and back of the network element chassis 120 to create an installation plane. The fan tray 110 can be installed and removed from the front of the network element chassis 120 through the installation plane.

FIG. 1B illustrates the back of the network element chassis 120 and the fan tray 110 of FIG. 1A according to one embodiment of the invention. As illustrated in FIG. 1B, the fan tray 110 can be inserted and/or removed from the back of the network element chassis 120 through the installation plane formed by the fan tray housing 130. As will be described in greater detail later herein, within the installation plane there is an installable position where a backplane connector can engage with a fan tray connector of a backplane of the network element. The fan tray 110 will be approximately flush with the edges of the front and back of the network element chassis 120 when in the installable position.

The fan tray 110 can pass the entire length through the network element chassis 120 via the fan tray housing 130. Typically there is not a panel or cover of the network element chassis 120 that needs to be removed to install or remove the fan tray 110. It should be understood that the fan tray 110 can be installed in a first direction (e.g., front or back of the network element chassis 120) and removed in a second, opposite, direction (e.g., front or back of the network element chassis 120).

The network element chassis 120 also includes a card housing for one or more line cards and one or more control cards (or service cards). Each card housing forms a slot with an opening on the front of the chassis 120. As illustrated in FIG. 1A, the cards are installed from the front of the chassis 120, however in other embodiments the cards may be installed from a different direction (e.g., from the back, from the side, from the top).

Figure 2A:
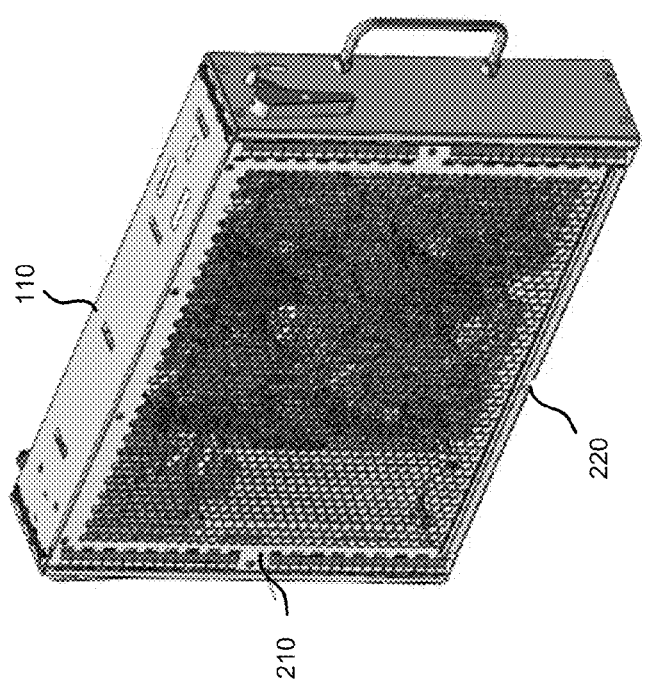
FIG. 2A illustrates an exemplary fan tray including an alignment key portion according to one embodiment of the invention.

FIG. 2A illustrates one side of the fan tray 110 according to one embodiment of the invention. As illustrated in FIG. 2A, the fan tray 110 includes the fan tray cover 210 and the alignment key portion 220. In one embodiment, the fan tray cover 210 includes a recessed portion and a raised portion, where the raised portion is closer to the ends of the fan tray 110. The raised portion provides tactile feedback to the user when installing or removing the fan tray 110 from the network element chassis 120. For example, the user installing or removing the fan tray 110 feels more tension as the ends of the fan tray 110 pass through the fan tray housing 130 as compared with the body of the fan tray 210. Since the fan tray housing 130 forms a tunnel running between the front and back of the network element that allows the fan tray 110 to pass through the entire chassis 120, the added friction of the raised portion of the fan tray cover 210 provides tactile feedback as the fan tray 110 is approaching the installation position (e.g., approximately flush with the front and back of the chassis 120).

The alignment key portion 220 ensures that the fan tray 110 is installed in the proper orientation. With reference to FIG. 2B, which illustrates the network element chassis 120 including the alignment key slot 230, the installer of the fan tray 110 aligns the fan tray 110 such that the alignment key portion 220 is inserted through the alignment key slot 230. It should be understood that the alignment key portion 220 prevents the fan tray 110 from being inserted into the fan tray housing 130 unless properly aligned with the alignment key slot 230.

As previously described, the fan tray 110 can be installed and removed from the front and back of the network element chassis 120. The fan tray 110 includes a backplane connector to connect the fan tray 110 with the backplane of the network element. The backplane provides connectors for the cards (e.g., line cards, control cards, service cards, etc.) of the network element and the fan tray. The backplane of the network element is coupled with a power supply of the network element. The fan tray 110 receives power and signals through pins of the backplane connector after engaging with a fan tray connector of the backplane (assuming the network element is turned on).

Figure 3:
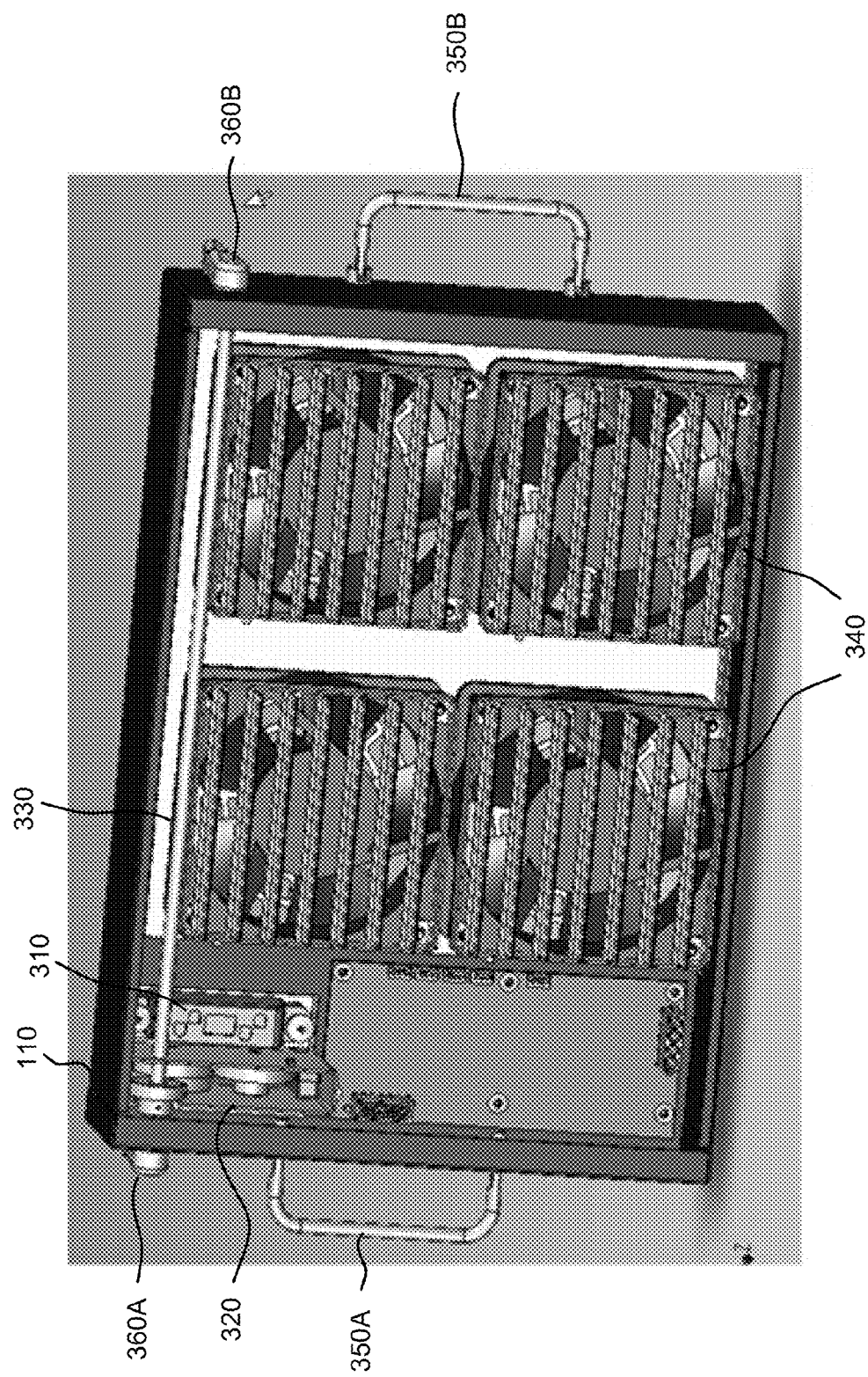
FIG. 3 illustrates the fan tray of FIG. 2A with a fan tray cover removed according to one embodiment of the invention.

FIG. 3 illustrates the fan tray 110 with the fan tray cover 210 removed for purposes of explanation. The fan tray 110 includes the engagement rod 330, which passes through the length of the fan tray 110 and has ends that protrude out of the front and back of the fan tray 110. The engagement levers 360A and 360B are attached at the ends of the engagement rod 330. The engagement levers 360A-B are movable between an unlocked position and a locked position responsive to rotational force. For example, the engagement levers 360A-B move responsive to being turned (e.g., by an installer, a customer, etc.). The engagement rod 330 ties the movement of the engagement levers 360A-B together. For example, moving the engagement lever 360A to the locked position causes the engagement lever 360B to move to the locked position.

The engagement rod 330 is coupled with the gearing mechanism 320. The gearing mechanism 320 translates rotational force into linear force to extend and withdraw a backplane connector assembly, which includes the backplane connector 310, which will be described in greater detail with reference to FIG. 4. For example, when the fan tray 110 is in the installable position and responsive to rotational force being applied to either of the engagement levers 360A-B to move the engagement levers 360A-B to the locked position, the gearing mechanism 320 translates that force to extend the backplane connector assembly to cause the backplane connector 310 to engage with a fan tray connector of the backplane of the network element chassis 120. As another example, while the fan tray 110 is installed and responsive to rotational force being applied to either of the engagement levers 360A-B to move the engagement levers 360A-B to the unlocked position, the gearing mechanism 320 translates that force to withdraw the backplane connector assembly to cause the backplane connector 310 to disengage with a fan tray connector of the backplane of the network element chassis 120.

The fan tray 110 also includes the fans 340 to provide cooling for the network element, and the fan tray handles 350A-B on each end for moving the fan tray 110 through the fan tray housing 130 of the network element chassis 120.

As illustrated in FIG. 3, the engagement lever 360B is positioned toward the front of the fan tray 110 and the engagement lever 360A is positioned toward the back of the fan tray 110 when installed in the network element chassis 120. Thus as illustrated in FIG. 3, the gearing mechanism 320 and the backplane connector 310 are toward the back of the fan tray 110. However, in other embodiments the gearing mechanisms 320 and the backplane connector 310 are toward the front of the fan tray 110.

As will be described in greater detail later herein, while the engagement levers 360A-B are in the unlocked position, the backplane connector assembly and the backplane connector 310 are withdrawn into the housing of the fan tray 110 (thus the backplane connector 310 is disengaged from the fan tray connector of the backplane) and the fan tray 110 can pass the entire length of the network element chassis 120 through the fan tray housing 130. In contrast, while the engagement levers 360A-B are in the locked position, the backplane connector assembly and the backplane connector 310 are extended out of the housing of the fan tray 110 (the backplane connector 310 will be engaged with the fan tray connector of the backplane if the fan tray 110 is in the installable position) and the fan tray is 110 is prevented from being installed or removed from the network element chassis 120.

Figure 4:
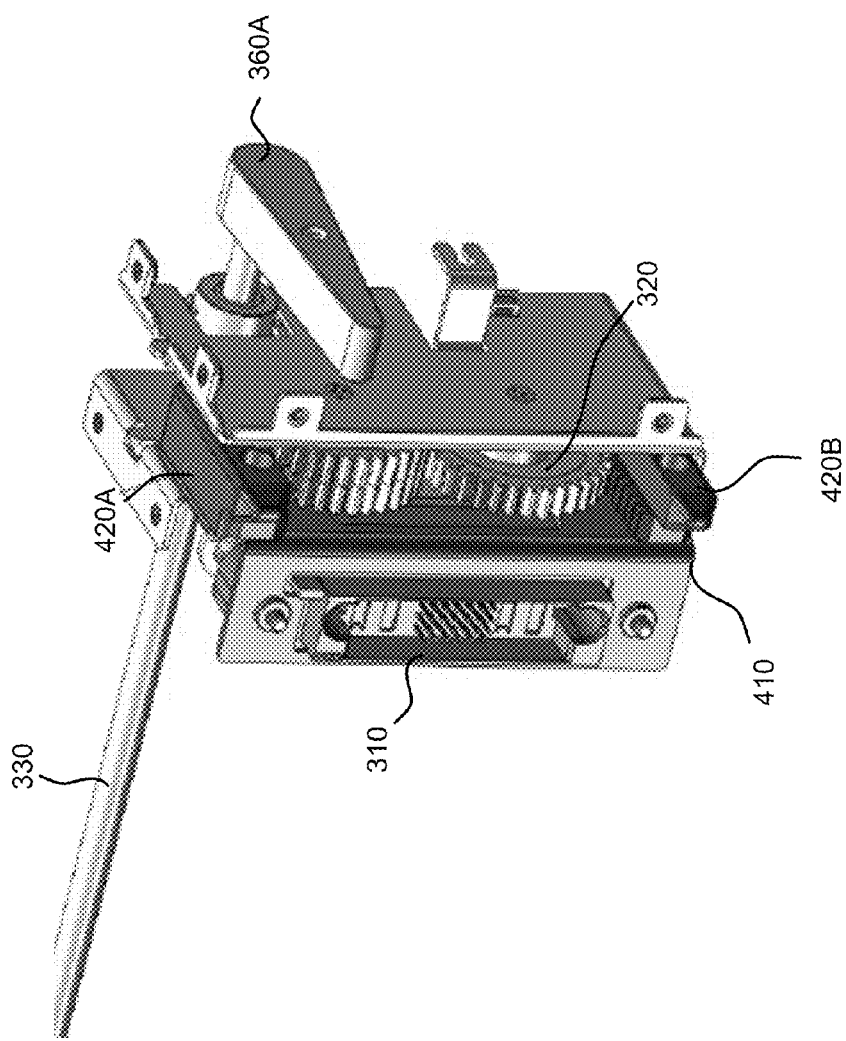
FIG. 4 illustrates components in the fan tray used to engage/disengage with a fan tray connector on the backplane of the network element according to one embodiment of the invention.

FIG. 4 illustrates components in the fan tray 110 used to engage/disengage with a fan tray connector on the backplane of the network element. The backplane connector assembly 410 includes the backplane connector 310 and the protective guide blocks 420A and 420B. The backplane connector 310 engages with a fan tray connector on the backplane of the network element. The backplane connector 310 includes pins for power and signal. The backplane connector 310 may also include pins for a status light on the fan tray 110 (e.g., an LED light) that indicates whether the backplane connector 310 is engaged with the fan tray connector of the backplane. In some embodiments the pins for the status light are shorter than the pins for power and signal to ensure that the power and signal pins are fully engaged prior to illuminating the engaged status light of the fan tray.

Movement of the engagement lever 360A causes the backplane connector assembly 410 to extend and withdraw in a plane that is perpendicular to the installation plane of the fan tray 110. While FIG. 4 illustrates the engagement lever 360A, it should be understood that movement of the engagement lever 360B also causes the backplane connector assembly 410 to extend and withdraw in a plane that is perpendicular to the installation plane of the fan tray 110. For example, movement of either of the engagement levers 360A-B to the locked position causes the backplane connector assembly to extend, and movement of either of the engagement levers 360A0B to the unlocked position causes the backplane connector assembly to withdraw. Thus, unlike typical prior art fan trays which include a backplane connector that that engages with a fan tray connector of the backplane in the same plane as the installation plane, the backplane connector 310, when in the installable position, engages and disengages with a fan tray connector of the backplane in a plane perpendicular to the installation plane of the fan tray 110.

The protective guide blocks 420A-B guide the backplane connector 310 to the installable position to safely engage with the fan tray connector of the backplane, as will be described in greater detail later herein. The protective guide blocks 420A-B extend beyond the backplane connector 310.

Figure 5:
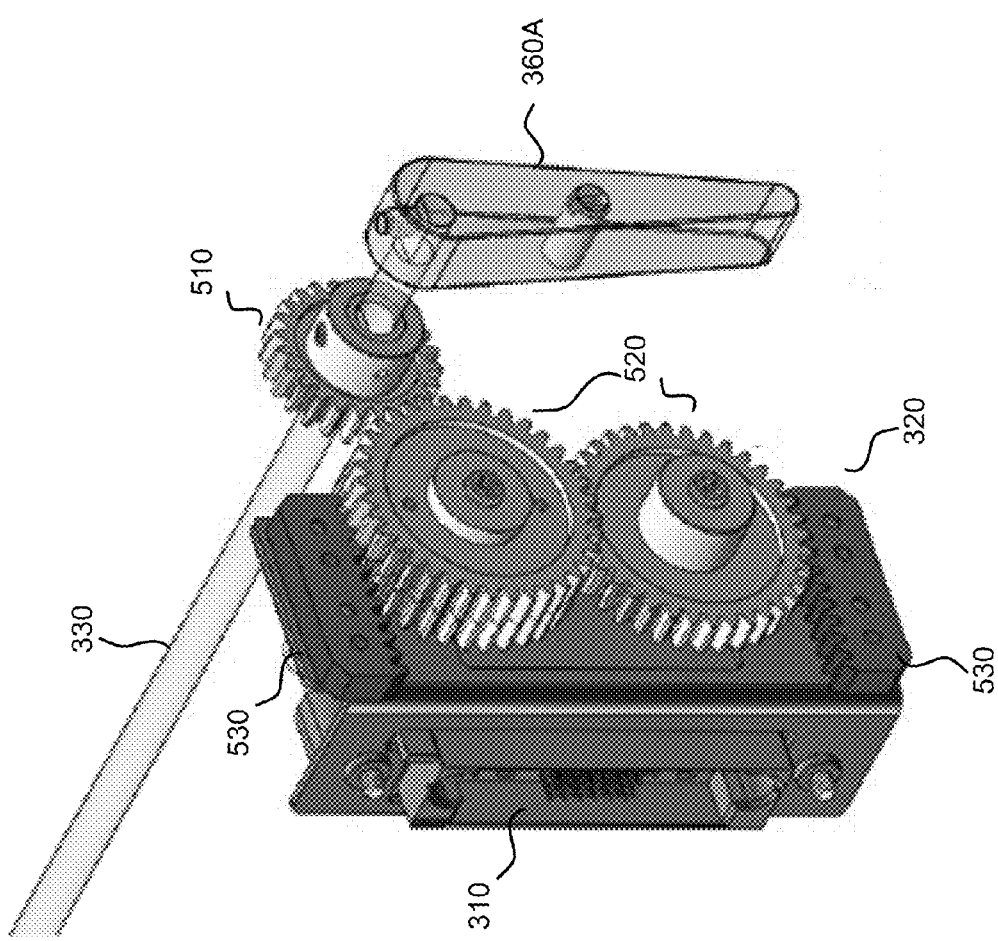
FIG. 5 illustrates an exemplary gearing mechanism of the fan tray according to one embodiment of the invention.

FIG. 5 illustrates the gearing mechanism 320 according to one embodiment of the invention The gearing mechanism 320 includes the drive gear 510, the spur gears 520A-B, and the rack mount gear 530. The drive gear 510 is attached to the engagement rod 330. Rotational force applied to turn either the engagement rod 360A or the engagement rod 360B causes the drive gear 510 to apply the force to the teeth of the spur gears 520, which then applies the force to the teeth of the rack mount gears 530, causing the backplane connector assembly 410 with the backplane connector 310 to linearly extend or withdraw depending on the direction of the rotational force. For example, if either engagement rod 360A-B is turned to the locked position, the gearing mechanism 320 causes the backplane connector assembly 410 to linearly extend. If either engagement rod 360A-B is turned to the unlocked position, the gearing mechanism 320 causes the backplane connector assembly 410 to linearly withdraw.

Figure 6:
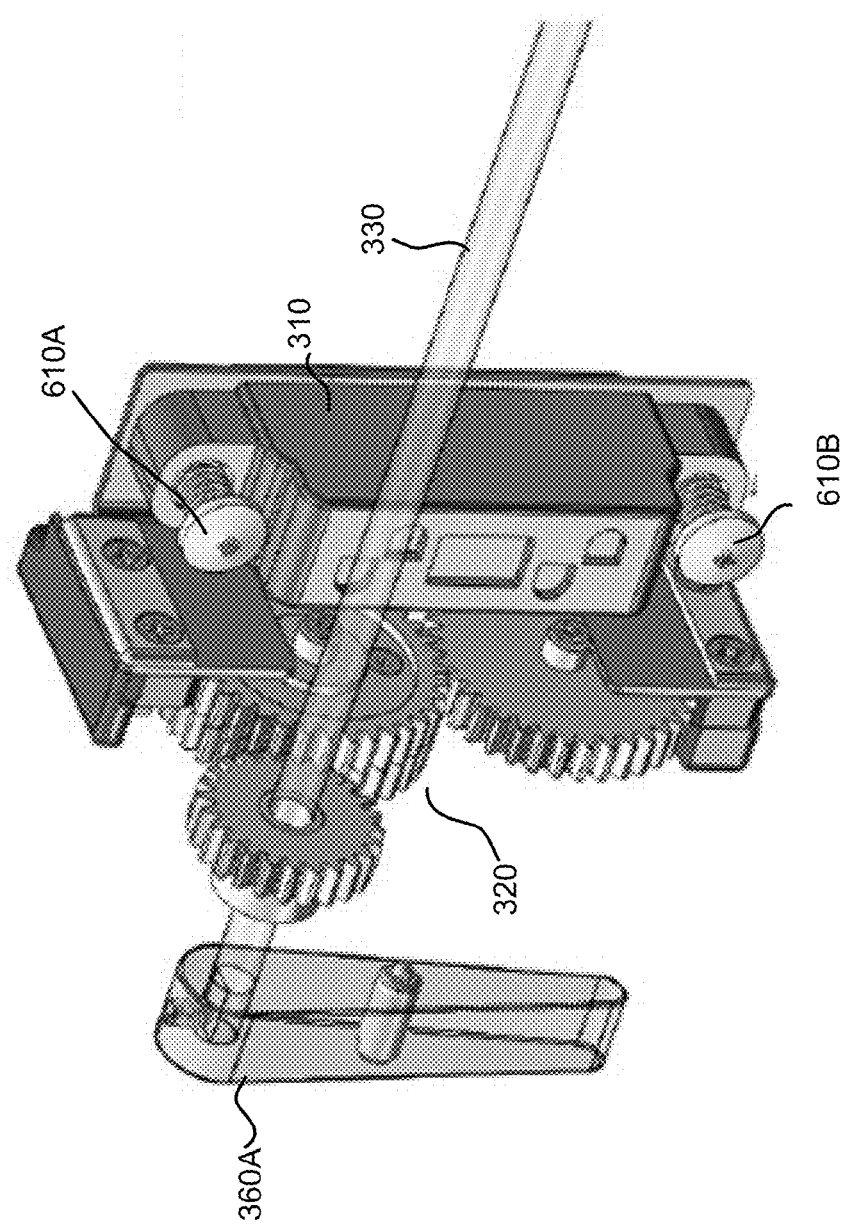
FIG. 6 illustrates the back of the backplane connector according to one embodiment of the invention.

FIG. 6 illustrates the back of the backplane connector 310 according to one embodiment of the invention. As illustrated in FIG. 6, the compression springs 610A-B are coupled to the backplane connector 310. The compression springs 610A-B assist in retaining the backplane connector 310 once engaged with the fan tray connector of the backplane.

FIG. 7A illustrates the end of the fan tray 110 facing the front of the network element chassis 120 according to one embodiment of the invention. The fan tray cover end portion 700 includes the groove 710, which is a recessed portion of the fan tray cover end portion 700 that is used by a detent in the engagement levers. FIG. 7B illustrates an exemplary engagement lever according to one embodiment of the invention. As illustrated in FIG. 7B, the engagement lever 360B includes the detent 730, which moves along the groove 710. The groove 710 includes the recessed portions 720A-720B in which the detent rests when the engagement lever is in the unlocked and locked position respectively. The fan tray cover end portion 700 also includes the status light 740. The status light 740 indicates whether the fan tray 110 is installed (e.g., whether the backplane connector 310 engaged with the fan tray connector of the backplane of the network element).

While FIG. 7A illustrates the end of the fan tray 110 facing the front of the network element chassis 120 (when installed), it should be understood that the end of the fan tray 110 facing the back of the network element chassis 120 (when installed) includes similar features and components. However, in one embodiment, a status light is only included on the end of the fan tray 110 facing the front of the network element chassis 120.

Figure 8A:
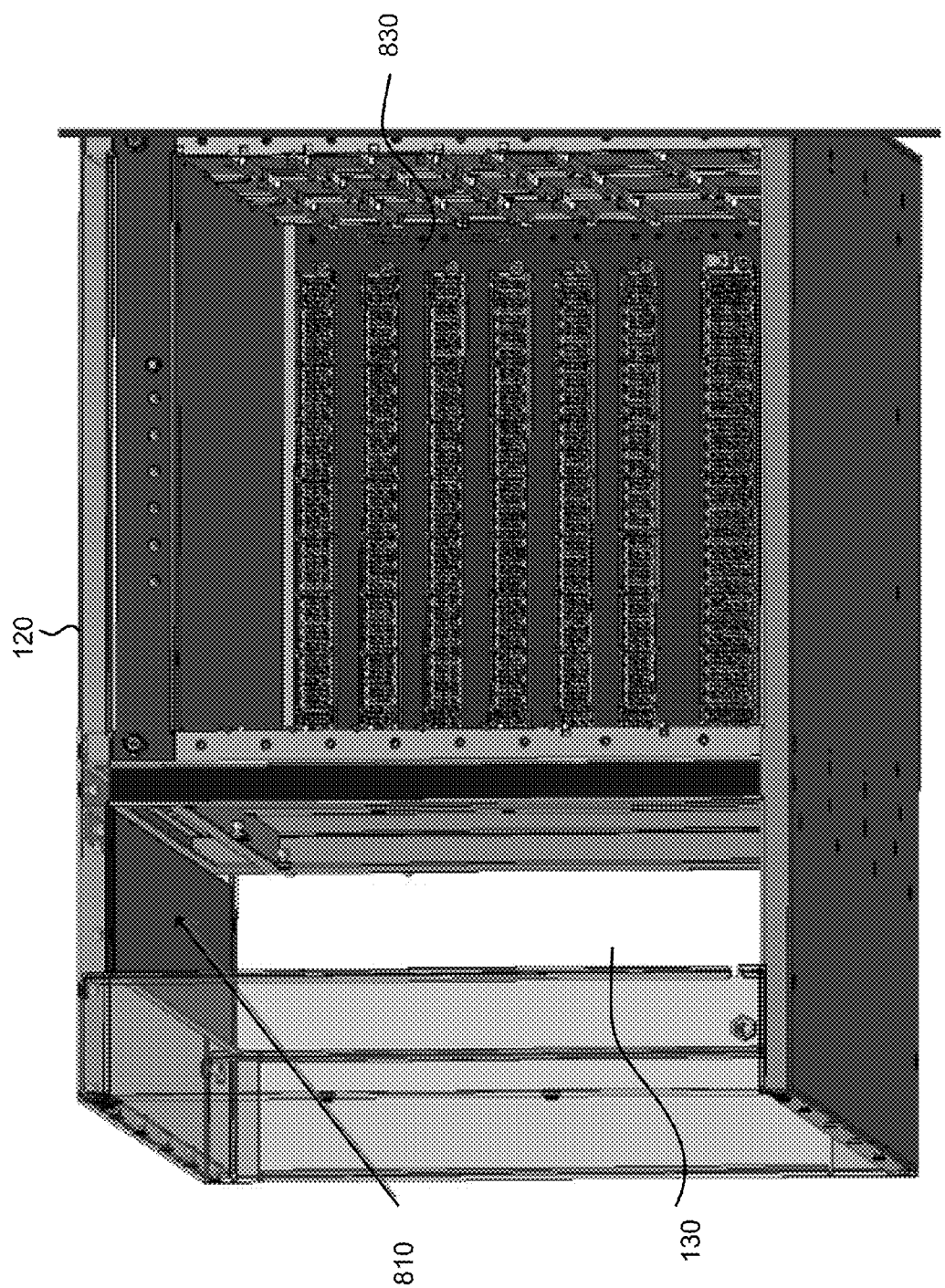
FIGS. 8A-B illustrate a top and bottom guide channel of the fan tray housing of the network element chassis for guiding the installation of the fan tray according to one embodiment of the invention.
Figure 8B:
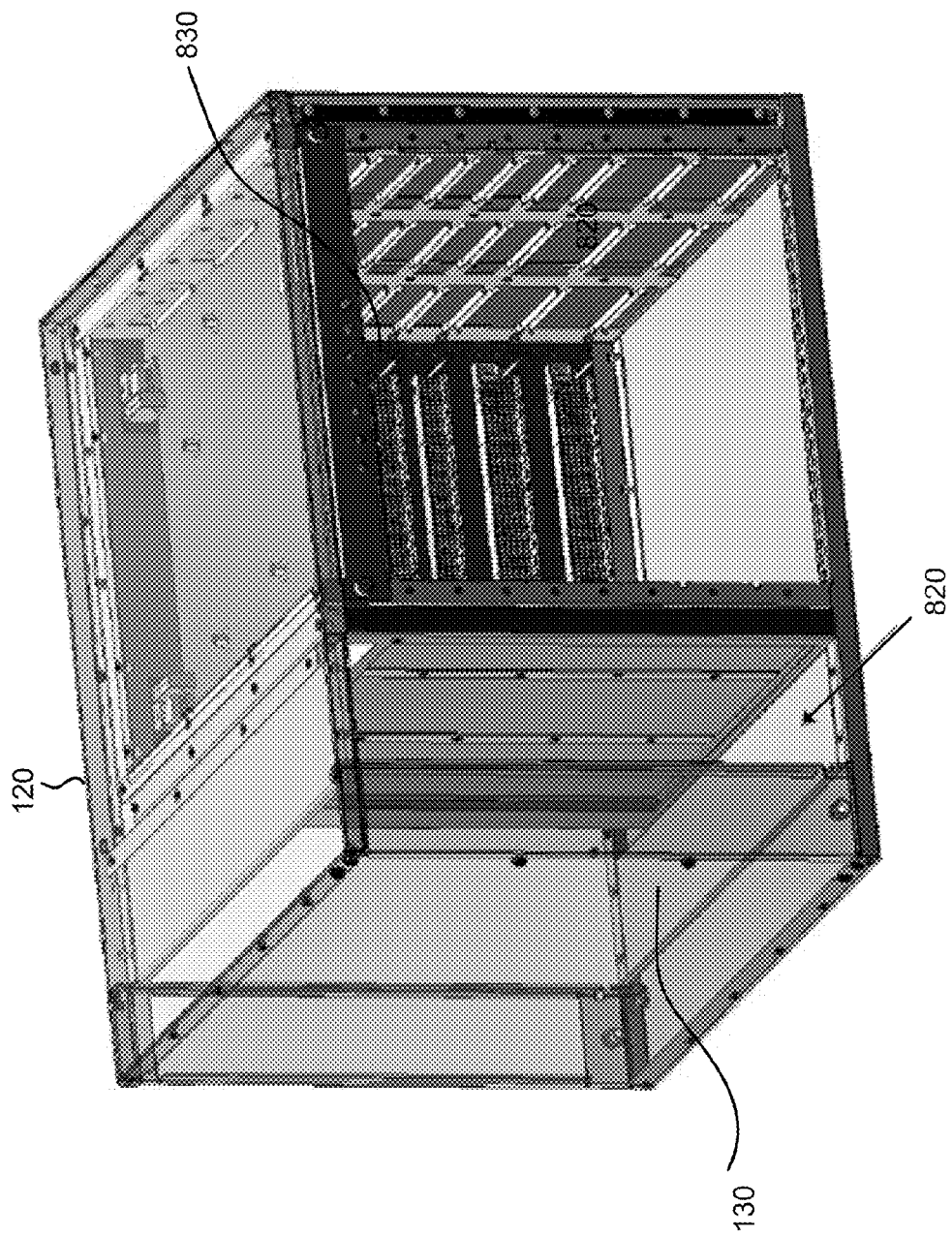

FIGS. 8A-B illustrate a top and bottom guide channel of the fan tray housing of the network element chassis for guiding the installation of the fan tray according to one embodiment of the invention. As illustrated in FIGS. 8A-B, the fan tray housing 130 includes the top guide channel 810 and the bottom guide channel 820 respectively to guide the installation of the fan tray through the installation plane of the network element chassis 120. FIGS. 8A-8B also illustrate the backplane 830 of the network element chassis 120, which includes multiple connectors for the cards (e.g., line cards, control cards, service cards, etc.) of the network element.

Figure 9A:
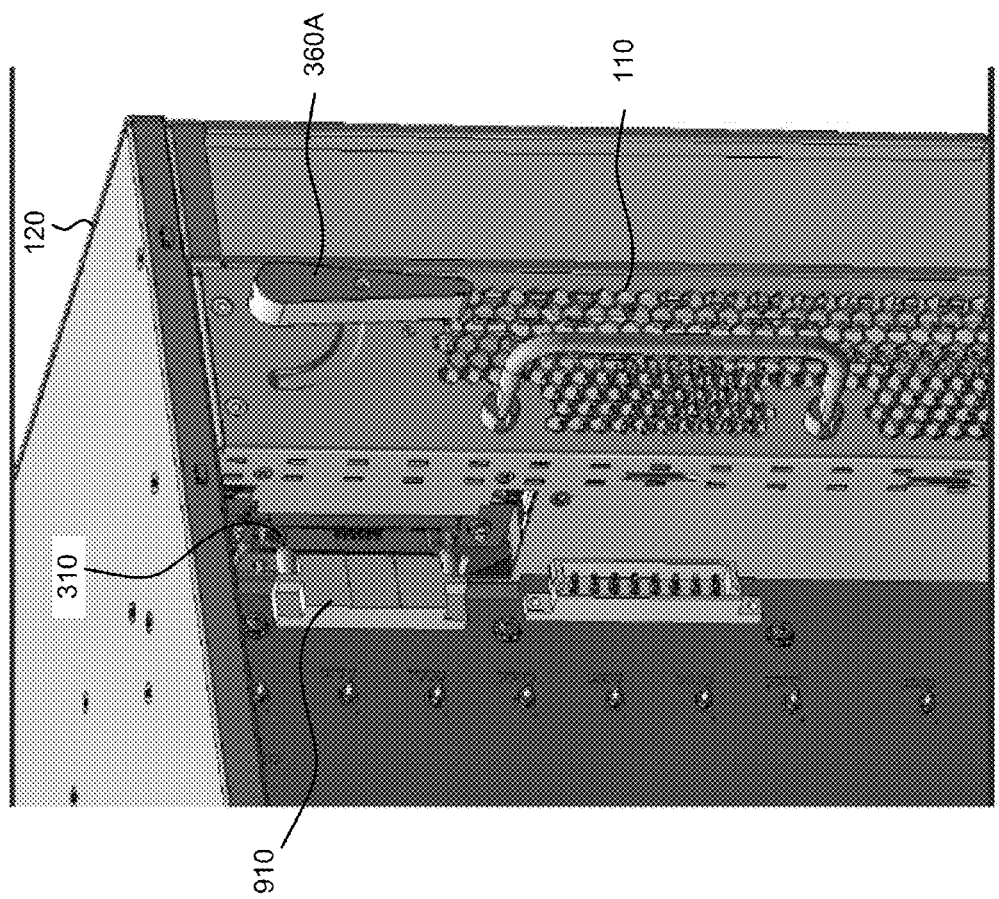
FIG. 9A illustrates a fan tray in the installable position of the network element chassis where the backplane connector of the fan tray is disengaged with the fan tray connector of the backplane according to one embodiment of the invention.

FIG. 9A illustrates the fan tray 110 in the installable position in the network element chassis 120 according to one embodiment of the invention. FIG. 9A illustrates the back of the network element chassis 120 with a back cover removed for purposes of explanation. It should be understood that in some embodiments the back cover of the network element chassis 120 does not cover or overlap the fan tray 110.

As illustrated in FIG. 9A, the fan tray 110 is approximately flush with the end of the network element chassis 120, and the backplane connector 310 is substantially aligned with the fan tray connector 910. The engagement lever 360A is in the unlocked position in FIG. 9A, and thus the backplane connector 310 is not extended beyond the housing of the fan tray 110. As such, the backplane connector 310 is not currently engaged with the fan tray connector 910 of the backplane of the network element chassis 120. As illustrated in FIG. 9A, when the engagement lever 360A is in the unlocked position, the backplane connector 310 is fully within the housing of the fan tray 110 and does not extend outside of the housing for the fan tray 110.

Figure 9B:
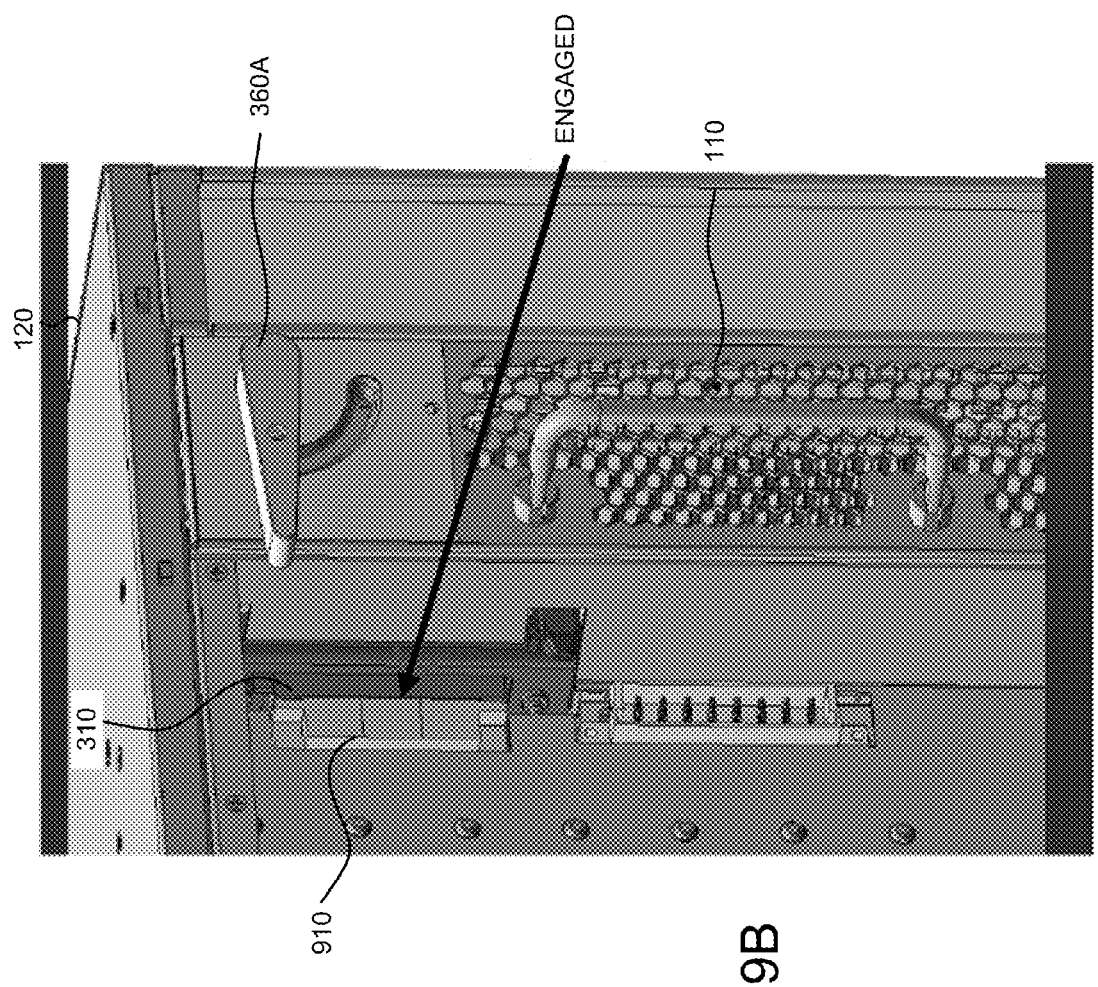
FIG. 9B illustrates a fan tray in the installable position of the network element chassis where the backplane connector of the fan tray is engaged with the fan tray connector of the backplane according to one embodiment of the invention.

In order to engage the backplane connector 310 with the fan tray connector 910, the installer of the fan tray 110 turns either of the engagement levers 360A or 360B to the locked position (which automatically causes the other lever to turn to the locked position). This causes the backplane connector assembly 410 to extend and the protective guide blocks 420A-B to guide the backplane connector 310 to safely engage with the fan tray connector 910. FIG. 9B illustrates the fan tray 110 with the backplane connector 310 engaged with the fan tray connector 910. As illustrated in FIG. 9B, the engagement lever 360A is in the locked position, and the backplane connector 310 has extended and engaged with the fan tray connector 910. After engaging with the backplane connector 310, the fan tray 110 will receive signals and power from the backplane through the backplane connector 310 (assuming the network element is operating).

As illustrated in FIG. 9B, the engagement lever 360A extends beyond the housing of the fan tray 110 when in the locked position. It should also be understood that the engagement lever 360B positioned toward the front of the fan tray 110 will also be in the locked position and will extend beyond the housing of the fan tray 110. Since both of the engagement levers 360A-B extend beyond the housing of the fan tray 110 when in the locked position, the fan tray 110 is prevented from being removed from the front and back of the network element chassis 120.

Figure 10B:
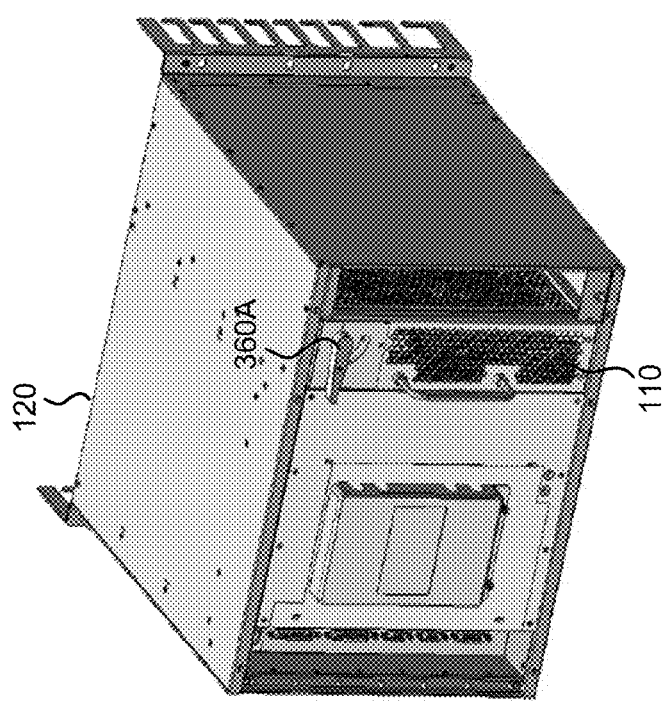
FIG. 10B illustrates the back of the exemplary network element chassis of FIG. 10A with the fan tray installed and in a locked position according to one embodiment of the invention.
Figure 10A:
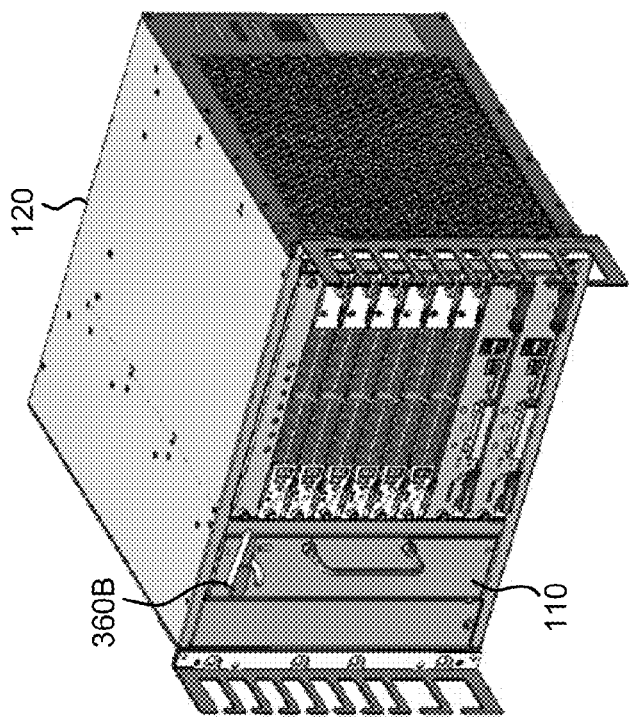
FIG. 10A illustrates the front of an exemplary network element chassis with a fan tray installed and in a locked position according to one embodiment of the invention.

FIG. 10A illustrates the front of the network element chassis 120 with the fan tray 110 installed and the engagement lever 360B in the locked position. FIG. 10B illustrates the back of the network element chassis 120 with the fan tray 110 installed and the engagement lever 360A in the locked position. As illustrated in FIGS. 10A-B, the engagement levers 360A-B each extend beyond the fan tray 110. Thus the fan tray 110 cannot be removed from the front or the back of the network element chassis 120 while the engagement levers 360A-B are in the locked position.

FIG. 11 is a flow diagram illustrating exemplary operations for installing a fan tray from either the front or back of a network element chassis according to one embodiment of the invention. The operations 1100 begin at block 1110, where an installer of the fan tray 110 aligns the alignment key portion 220 of the fan tray 110 with the alignment key slot 230 of the fan tray housing 130 of the network element chassis 120. As previously described, aligning the alignment key portion 220 with the alignment key slot 230 ensures proper orientation of the fan tray 110, since the alignment key portion 220 prevents the fan tray 110 from being inserted in the wrong orientation. Flow moves from block 1110 to block 1120.

At block 1120, the installer slides the fan tray 110, through the installation plane created by the fan tray housing 130, from either the front or back of the network element chassis 120, until the fan tray 110 is approximately flush with the front and back of the network element chassis 120. It should be understood that the engagement levers 360A-B are in the unlocked position, and the backplane connector assembly 410 is within the housing of the fan tray 110 when the fan tray 110 is slid into the fan tray housing 130. Flow moves from block 1120 to block 1130.

At block 1130, the installer turns either of the engagement levers 360A-B to the locked position to cause the backplane connector 410, and thus the backplane connector 310, to engage with the fan tray connector 910 of the backplane of the network element chassis 120. As previously described, to lower the risk of damaging either the backplane connector 310 or the fan tray connector 910, the protective guide blocks 420A-B guide the backplane connector 310 to the installable position such that the backplane connector 410 safely engages with the fan tray connector 910 of the backplane.

The backplane connector 310 engages with the fan tray connector 910 in plane that is perpendicular to the installation plane. As previously described, turning one of the engagement levers 360A-B automatically causes the other engagement lever to turn substantially the same amount. The engagement levers 360A-B are in the locked position while the backplane connector 310 is engaged with the fan tray connector 910, thus preventing the fan tray 110 from being removed from either the front or back of the network element chassis 110.

Thus, the fan tray described herein is installable and removable from the front and back of the network element chassis. By way of example, unlike typical systems where fan trays must be removed from the front of the network element chassis, cabling (e.g., connecting the line cards, control cards, to each other and/or to other network elements), which is typically in the front of the network element chassis, does not need to removed when removing the fan tray since the fan tray can be removed from the back of the network element chassis.

While the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A fan tray for a network element that is installable and removable from the front and back of a network element, wherein the network element includes a housing that forms a tunnel running between the front and back of the network element to create an installation plane, wherein there is an installable position in the tunnel along the installation plane for the fan tray, the fan tray comprising:
   one or more fans in a housing to provide cooling for the network element;
   an engagement rod with ends that protrude out a front and back of the housing, wherein the engagement rod is within the installation plane when the fan tray is installed;
   a first engagement lever at one end of the engagement rod and a second engagement lever at an opposite end of the engagement rod, the first and second engagement levers are movable between an unlocked and locked position, and wherein movement of the first and second engagement levers is tied together;
   a gearing mechanism coupled to the engagement rod to translate rotational force, to be applied to the engagement levers to move between the unlocked and locked position, into linear force to extend and withdraw a backplane connector assembly coupled to the gearing mechanism; and
   the backplane connector assembly including a backplane connector to engage and disengage with a fan tray connector of a backplane of the network element in a plane perpendicular to the installation plane of the fan tray according to movement of the engagement levers, the backplane connector to engage and disengage with the fan tray connector responsive to the engagement levers respectively moving to the locked and unlocked position while the fan tray is in the installable position, whereby the fan tray is installable and removable from the front and back of the network element.

2. The fan tray of claim 1, wherein the backplane connector assembly further includes one or more protective guide blocks to guide the backplane connector to the installable position to safely engage with the fan tray connector of the backplane, and wherein the one or more protective guide blocks extend beyond the backplane connector.

3. The fan tray of claim 1, further comprising an alignment key portion to be inserted into an alignment key slot of the network element to ensure proper orientation of the fan tray during installation.

4. The fan tray of claim 1, wherein the first and second engagement levers each include a detent to move along a groove in a fan tray cover end portion and stop in a first recessed portion of that fan tray cover end portion in the unlocked position and stop in a second recessed portion of that fan tray cover end portion in the locked position.

5. The fan tray of claim 1, wherein the backplane connector assembly further includes one or more compression springs to assist in retaining the backplane connector once engaged with the fan tray connector of the backplane.

6. The fan tray of claim 1, further comprising one or more status lights to indicate whether the backplane connector is engaged with the fan tray connector of the backplane.

7. The fan tray of claim 6, wherein the backplane connector includes a plurality of pins for power, signals, and the one or more status lights.

8. The fan tray of claim 7, wherein the pins for the one or more status lights are shorter than the pins for power and signals.

9. A network element chassis adapted to allow a fan tray to be installed and removed from the front and back of the network element chassis, comprising:
- a card housing for each of one or more line cards and one or more control cards, wherein each of the card housings forms a slot with an opening on the front of the network element;
- a fan tray housing for the fan tray to allow the fan tray to be inserted and removed from the front and back of the network element chassis without removing a panel or cover of the fan tray, wherein the fan tray housing forms a tunnel running between the front and back of the network element to create an installation plane, wherein there is an installable position in the tunnel along the installation plane for the fan tray, the fan tray housing including one or more guide channels to guide insertion and removal of the fan tray; and
- a backplane including a fan tray connector to engage and disengage with a backplane connector of the fan tray in a plane perpendicular to an installation plane of the fan tray.

10. The network element chassis of claim 9, wherein the one or more guide channels includes a top and bottom guide channel.

11. The network element chassis of claim 10, wherein the fan tray housing for the fan tray further includes an alignment key slot to receive an alignment key portion of the fan tray to ensure proper orientation of the fan tray during installation.

12. The network element chassis of claim 11, wherein the fan tray connector is to receive pins from the backplane connector for signals, power to the fan tray, and one or more status lights on the fan tray.

13. A network element including a fan tray that is installable and removable from the front and back of a network element, comprising:
- a card housing for each of one or more line cards and one or more control cards, wherein each of the card housings forms a slot with an opening on the front of the network element and a connector at the back of the network element;
- a fan tray housing for the fan tray that allows the fan tray to be inserted and removed from the front and back of the network element chassis without removing a panel or cover of the fan tray, wherein the fan tray housing forms a tunnel running between the front and back of the network element to create an installation plane, wherein there is an installable position in the tunnel along the installation plane for the fan tray;
- a backplane including a fan tray connector to engage and disengage with a backplane connector of the fan tray; and
- the fan tray including,
  - one or more fans in a housing that provide cooling for the network element,
  - an engagement rod with ends that protrude out a front and back of the housing, wherein the engagement rod is within the installation plane when the fan tray is installed,
  - a first engagement lever at one end of the engagement rod and a second engagement lever at an opposite end of the engagement rod that move between an unlocked and locked position, wherein movement of the first and second engagement levers is tied together, and wherein the first and second engagement levers prevent the fan tray from being installed or removed from the network element when in the locked position,
  - a gearing mechanism coupled to the engagement rod that translates rotational force, applied to the engagement levers, into linear force to extend and withdraw a backplane connector assembly coupled to the gearing mechanism, and
  - the backplane connector assembly including the backplane connector that engages and disengages with the fan tray connector of the backplane in a plane perpendicular to the installation plane of the fan tray according to the movement of the engagement levers, the backplane connector to engage and disengage with fan tray connector responsive to the engagement levers respectively moving to the locked and unlocked position while the fan tray is in the installable position, whereby the fan tray is installable and removable from the front and back of the network element.

14. The network element of claim 13, wherein the fan tray housing for the fan tray includes one or more guides to guide insertion and removal of the fan tray.

15. The network element of claim 13, wherein the backplane connector assembly further includes one or more protective guide blocks that guides the backplane connector to the installable position to safely engage the fan tray connector of the backplane, wherein the one or more protective guide blocks extend beyond the backplane connector.

16. The network element of claim 13, wherein the backplane connector assembly further includes one or more compression springs to assist in retaining the backplane connector once engaged with the fan tray connector of the backplane.

17. The network element of claim 13, wherein the fan tray housing for the fan tray further includes an alignment key slot, and wherein the fan tray further includes an alignment key portion to be inserted into the alignment key slot to ensure proper orientation of the fan tray during installation.

18. The network element of claim 13, wherein the first and second engagement levers further include a detent to move along a groove in a fan tray cover end portion and stop in a first recessed portion of the fan tray cover end portion in the unlocked position and a second recessed portion of the fan tray cover end portion in the locked position.

19. The network element of claim 13, wherein the fan tray further includes a status light to indicate whether the backplane connector is engaged with the fan tray connector of the backplane.

20. The network element of claim 19, wherein the backplane connector includes a plurality of pins that provides connection to power and signals to the fan tray and a set of one or more pins for the status light that are shorter than the plurality of pins that provides connection to power and signals to the fan tray.

21. A method to install a fan tray in a network element chassis that includes a housing that forms a tunnel passing all the way through the network element to create an installation plane, wherein the fan tray includes a first and second engagement lever on opposite sides of the fan tray to both lock and unlock the fan tray and engage and disengage a backplane connector of the fan tray to a fan tray connector of a backplane of the network element chassis, wherein there is an installable position in the tunnel along the installation plane for the fan tray, the method comprising the steps of:

- aligning an alignment key portion of the fan tray with an alignment key slot of the network element chassis to ensure proper orientation of the fan tray, wherein the alignment key portion prevents the fan tray from being inserted in the wrong orientation;
- sliding the fan tray from either the front or back of the network element chassis until it is approximately flush with the front and back of the network element chassis, wherein the engagement levers are in an unlocked position while the fan tray is slid into the network element chassis;
- while the fan tray is approximately flush with the front and back of the network element chassis, turning either of the first and second engagement levers in a first direction to cause the backplane connector to engage the fan tray connector and lock the fan tray while engaged, wherein turning one of the engagement levers causes the other engagement lever to automatically turn substantially the same amount, wherein the engagement levers are in a locked position while the backplane connector is engaged to the fan tray connector and prevent the fan tray from being removed from the front and back of the network element chassis, and wherein one or more protective guides that extend beyond the backplane connector guide the backplane connector to safely engage the fan tray connector to prevent the connectors from being damaged, whereby the fan tray is installable from the front and back of the network element chassis.

22. The method of claim 21, wherein the fan tray further includes one or more status lights that indicate whether the backplane connector is successfully connected with the fan tray connector.

* * * * *

UNITED STATES PATENT AND TRADEMARK OFFICE
CERTIFICATE OF CORRECTION

PATENT NO.        : 8,116,082 B2                                              Page 1 of 1
APPLICATION NO.   : 12/620518
DATED             : February 14, 2012
INVENTOR(S)       : Beaudoin et al.

It is certified that error appears in the above-identified patent and that said Letters Patent is hereby corrected as shown below:

On the Title page, Item (75), under "Inventors", Line 1, delete "Surrey"
and insert -- Surrey, BC --, therefor.

On the Title page, Item (75), under "Inventors", Line 5, delete "Vancouver"
and insert -- Vancouver, BC --, therefor.

In Column 3, Line 29, delete "chassis" and insert -- chassis. --, therefor.

In Column 7, Line 38, delete "invention" and insert -- invention. --, therefor.

Signed and Sealed this
Nineteenth Day of June, 2012

David J. Kappos
*Director of the United States Patent and Trademark Office*